United States Patent [19]
Jencks et al.

[11] Patent Number: 5,512,709
[45] Date of Patent: Apr. 30, 1996

[54] ELECTROMAGNETIC EMISSION-SHIELDING GASKET

[76] Inventors: Andrew D. Jencks, 540 Prospect St., Seekonk, Mass. 02771; John DiGioia, 780 Oak Hill Rd., North Kingstown, R.I. 02852

[21] Appl. No.: 294,541

[22] Filed: Aug. 23, 1994

Related U.S. Application Data

[62] Division of Ser. No. 203,464, Feb. 28, 1994, abandoned.

[51] Int. Cl.$^6$ ..................................................... H05K 9/00
[52] U.S. Cl. .......................... 174/35 GC; 66/192; 87/29
[58] Field of Search ........................... 174/35 R, 35 GC, 174/36; 87/6, 7, 29; 66/81, 192, 193; 428/209, 356

[56] References Cited

U.S. PATENT DOCUMENTS

| | | | |
|---|---|---|---|
| Re. 33,256 | 7/1990 | Busby | 174/35 GC |
| 2,462,334 | 2/1949 | Pierson | 174/35 GC |
| 2,674,644 | 4/1954 | Goodloe | 174/35 GC |
| 2,755,079 | 7/1956 | York et al. | 267/147 |
| 2,761,203 | 9/1956 | DeWitt, Sr. | 66/196 |
| 3,206,536 | 9/1965 | Goodloe | 174/35 GC |
| 3,247,312 | 4/1966 | Alessi | 174/35 GC |
| 3,566,064 | 2/1971 | Neillis | 200/305 |
| 3,578,764 | 5/1971 | Nunnally | 87/6 |
| 3,812,316 | 5/1974 | Milburn | 219/741 |
| 3,842,628 | 10/1974 | Bennett et al. | 66/193 |
| 4,037,009 | 7/1977 | Severinsen | 277/230 |
| 4,065,138 | 12/1977 | Severinsen | 428/241 |
| 4,123,830 | 11/1978 | Matsuda et al. | 66/192 |
| 4,375,009 | 2/1983 | Fearnside et al. | 174/36 |
| 4,639,545 | 1/1987 | Pithouse et al. | 174/36 |
| 4,652,695 | 3/1987 | Busby | 174/35 GC |
| 4,684,762 | 8/1987 | Gladfelter | 174/36 |
| 4,705,916 | 11/1987 | Wadhera et al. | 174/35 GC |
| 4,731,500 | 3/1988 | Otsuka | 174/36 |
| 4,781,039 | 11/1988 | Ribarev et al. | 66/80 |
| 4,785,136 | 11/1988 | Mollet et al. | 174/35 R |
| 4,822,060 | 4/1989 | Moyer et al. | 277/166 |
| 4,838,043 | 6/1989 | Jencks | 66/170 |
| 4,857,668 | 8/1989 | Buonanno | 174/35 GC |
| 4,863,789 | 9/1989 | Arai | 428/253 |
| 4,900,877 | 2/1990 | Dubrow et al. | 174/35 GC |
| 4,921,751 | 5/1990 | Wakahara et al. | 428/229 |
| 4,931,326 | 6/1990 | Weil | 428/35.6 |
| 4,966,637 | 10/1990 | Laborie | 156/47 |
| 4,977,759 | 12/1990 | Jencks | 66/81 |
| 5,006,666 | 4/1991 | Laborie | 174/35 GC |
| 5,028,730 | 7/1991 | Keyser et al. | 174/35 GC |
| 5,045,635 | 9/1991 | Kaplo et al. | 174/35 GC |
| 5,105,056 | 4/1992 | Hoge, Jr. et al. | 174/35 GC |
| 5,142,101 | 8/1992 | Matsuzaki et al. | 174/35 GC |
| 5,202,536 | 4/1993 | Buonanno | 174/35 GC |

FOREIGN PATENT DOCUMENTS 2256092  11/1992  United Kingdom.

Primary Examiner—Kristine L. Kincaid
Assistant Examiner—Christopher Horgan
Attorney, Agent, or Firm—Bell, Seltzer, Park & Gibson

[57] ABSTRACT

A gasket is disclosed for shielding from electromagnetic emissions and interference (EMI) that exhibits excellent characteristics of recovery, bending, and tangential compression over a wide range of frequencies. The gasket includes a knitted core of monofilament synthetic polymer yarns, and a circular warp knitted sheath over the monofilament knitted core, with the sheath being sufficiently conductive to provide shielding from electromagnetic interference over a wide range of frequencies.

22 Claims, 3 Drawing Sheets

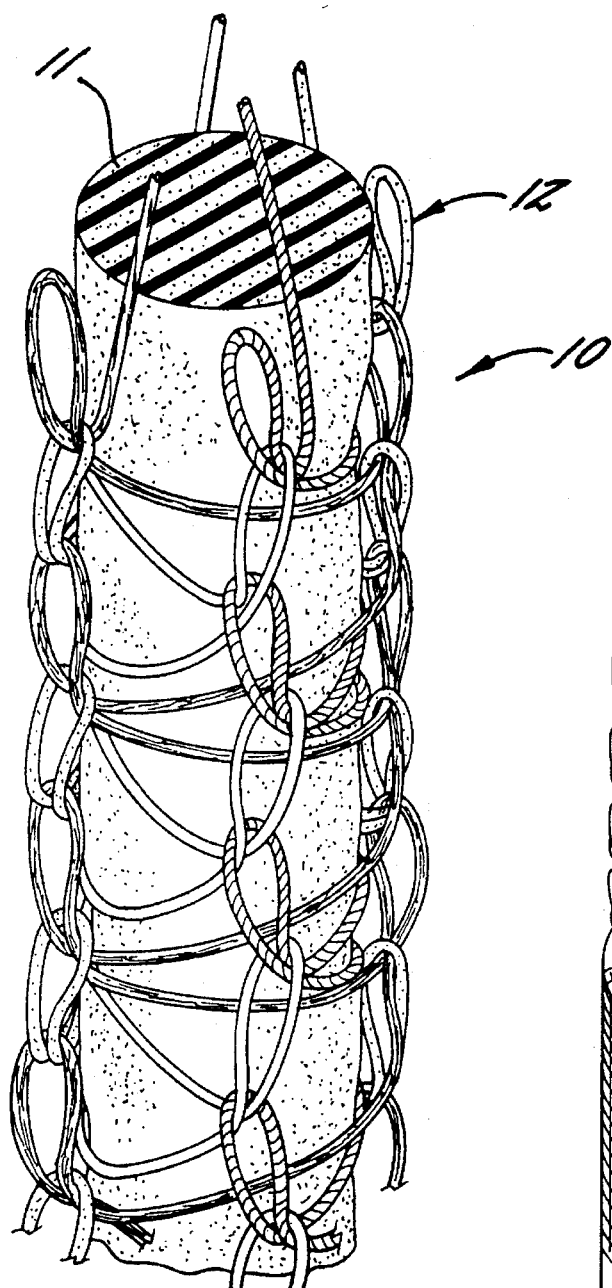
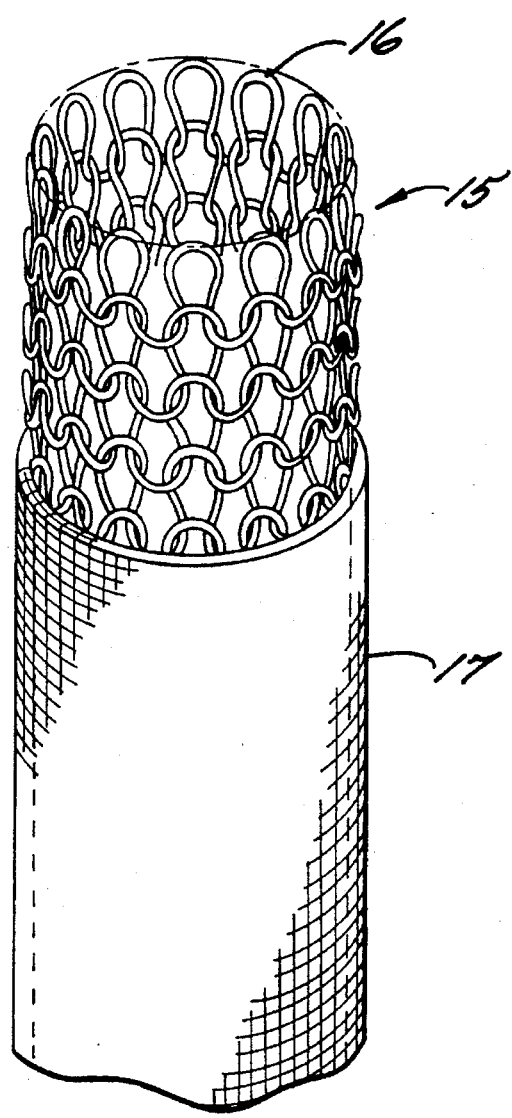
fig.1.
fig.2.

ELECTROMAGNETIC EMISSION-SHIELDING GASKET

This application is a divisional of Ser. No. 08/203,464, filed Feb. 28, 1994, now abandoned.

FIELD OF THE INVENTION

The present invention relates to structures for shielding against emission of electromagnetic radiation ("electromagnetic interference" or "EMI"), and in particular relates to an electromagnetic emission-shielding gasket for use in conjunction with other EMI shielding structures.

BACKGROUND OF THE INVENTION

The use of electrical and electronic equipment has multiplied rapidly in all fields in the last several decades. To a great extent, this growth has been fueled by the corresponding growth in the semiconductor industry which has provided ever more powerful electronic devices of ever decreasing size. The result has been the beneficial invasion of electrical and electronic devices into almost every area of life; home, office, work place, industry, laboratory, hospital, and school. An unintended consequence of the presence of electrical and electronic devices in such areas, however, is the potential that the electromagnetic emissions produced by the devices may be harmful to persons working in the immediate or general vicinity of those devices. Furthermore, newer devices often operate at high frequencies and contain relatively large circuits or amounts of circuitry in relatively small spaces.

Additionally, the devices themselves must also generally be protected from external interference of the same type; i.e., electrical or magnetic interference. Thus, most electronic devices are shielded for several purposes. Although protection of nearby personnel from electromagnetic emissions is one purpose of shielding, shielding is also used to reduce or prevent electrostatic coupling between the shielded item and other electronic items that may be either susceptible to or generators of electrostatic fields. Shielding can also improve performance of apparatus or test equipment by reducing losses, voltage gradients, or interference. Shielding is generally defined as a housing, screen or other object, usually conducting, that substantially reduces the effect of electric or magnetic fields on one side of the shield, and upon devices or circuits on the other side. Brief discussions of shielding can be found in almost any text or technical book of electronics or electrical equipment including the *IEEE Standard Dictionary of Electrical and Electronics Terms*, 1988, the Institute of Electrical and Electronics Engineers, Inc.

The most common method of shielding an electronic or electrical device is to place it inside of a conductive housing, as noted above, usually made of metal. From a practical standpoint, such housings or cabinets are typically and preferably formed in several parts which can be disassembled or otherwise opened to allow access to the electronic or electrical components inside. As a result, there exist joints or borders between and among the shielding components from which electromagnetic emissions can escape. Thus, in order to shield the boundaries between portions, and while permitting normal use and access, an electromagnetic shielding gasket material is typically used in a manner generally analogous to the manner in which a piece of weatherstripping prevents unwanted drafts from passing around a door or a window.

Early forms of such EMI gaskets consisted of stamped forms usually formed from metals such as Monel, copper, nickel, aluminum, and stainless steel. Although metals are highly conductive and thus provide excellent shielding properties, stamped metal gaskets exhibit some common disadvantages. First, they lack suppleness which prevents them from conforming to any unusual curvature or other shape in a shielding cabinet. Second, they require high closure pressures which in turn limits their use to very robust cabinets. Third, metal gaskets suffer permanent deformation when they are initially closed which tends to loosen subsequent closures between adjacent surfaces. Fourth, metal gaskets are often difficult to mount in a manner that will hold the gasket in place when the cabinet is opened.

Because of these and other disadvantages of stamped metal, other types of EMI gaskets have been developed. One alternative uses elastomeric materials as core elements under a conductive gasket sheath in an attempt to lower closure forces and improve suppleness. Other improvements include the direct attachment of the gasket to the boundary to be shielded using an adhesive, thus facilitating the gasket's attachment. A third type of improvement has replaced conductive wires or pure metals with silver plated yarn fabrics which tend to be somewhat more supple and resist permanent deformation from repeated closures better than the entirely metal gaskets.

Nevertheless, sheath and core gaskets, for example a elastomeric core with a conductive fabric covering, still exhibit certain disadvantages. In particular, cores formed from certain elastomers tend to suffer from too low a closure force—i.e., they deform too easily—with a corresponding lack of recovery to an original form after extended closure. Other elastomers suffer from the opposite problem of an unacceptably high closure force—i.e., they resist deformation too strongly—resulting from the attempt to reduce the "compression set" in the elastomer. To date, neither problem has been successfully addressed. Core materials such as polyurethane, for example, exhibit the low closure force that exhibits the corresponding lack of recovery problems. More resilient materials such as neoprene and silicone rubber will appropriately recover to their original form, but require overly high closure forces.

Such conventional gaskets exhibit other problems as well. These include a natural resistance against being bent into too sharp of a corner, torque bias, an inappropriately large distortion in volume or shape when placed in certain configurations, and other related problems.

OBJECT AND SUMMARY OF THE INVENTION

Therefore, it is an object of the present invention to provide an EMI gasket that has the appropriate EMI shielding properties, which exhibits good compression under moderate force and at the same time good recovery to its original shape, which can be formed into corners without distortion, and which minimizes torque bias to thereby offer superior suppleness and conformity to curve the irregular surfaces.

The invention meets this object with a gasket for shielding from electromagnetic emissions which comprises a core formed of a compressible resilient material, and a circular warp knitted sheath over the compressible core material, with the sheath being sufficiently conductive to provide shielding from electromagnetic interference.

In another embodiment, the invention comprises such a gasket with a knitted core of monofilament synthetic polymer yarns; and in yet a third embodiment, the invention comprises the combination of a circular warp knitted conductive sheath and the knitted core formed from monofilament synthetic polymer yarns.

The foregoing and other objects, advantages and features of the invention, and the manner in which the same are accomplished, will become more readily apparent upon consideration of the following detailed description of the invention taken in conjunction with the accompanying drawings, which illustrate preferred and exemplary embodiments, and wherein:

DESCRIPTION OF THE DRAWINGS

FIG. 1 is a perspective view of an EMI gasket according to the present invention with a resilient core, and a circular warp knitted sheath;

FIG. 2 is another embodiment of an EMI gasket according to the present invention in which the core is a tubular knit structure formed from monofilament yarns, and the sheath is a woven conductive fabric;

DETAILED DESCRIPTION OF THE PREFERRED EMBODIMENTS

The present invention is a gasket for shielding from electromagnetic emissions (EMI) that exhibits excellent characteristics of recovery, bending and tangential compression. FIG. 1 illustrates a first embodiment of a gasket according to the present invention broadly designated at 10. The gasket 10 comprises a core 11 formed of a compressible resilient material such as neoprene, polyurethane, butadiene rubber, or other material that will appropriately compress under pressure, but which can be appropriately bent to fit corners and other such structural shapes where EMI gaskets are required. Such materials are well known to those of ordinary skill in the art and will not be otherwise elaborated on herein.

A circular warp knit sheath broadly designated at 12 overlies the compressible core material 11 and is sufficiently conductive to provide shielding from electromagnetic interference over a wide range of frequencies. As used herein, warp knitting represents a type of knitting in which the yarns generally run lengthwise in the fabric; i.e., analogous to the direction of warp yarns in a woven fabric. The yarns are typically prepared as warps on beams with one or more yarns for each needle. Appropriate definitions for the textile terms used herein are familiar to those of ordinary skill in this art, and can be found, for example, in the *Dictionary of Fiber and Textile Technology*, Hoechst Celanese, 1990; Spencer, Knitting Technology, 2d ed. 1989; Schwartz, et al., *Fabric Forming Systems*, 1982; or other appropriate textbooks or dictionaries of textile engineering and terminology. The term "circular warp knit fabric," as its name implies, refers to a tubular warp knit fabric which is formed by supplying a number of individual yarns to the needles of a circular knitting machine and then knitting with all of the needles at the same time to produce a complete course at once.

Figure 3:
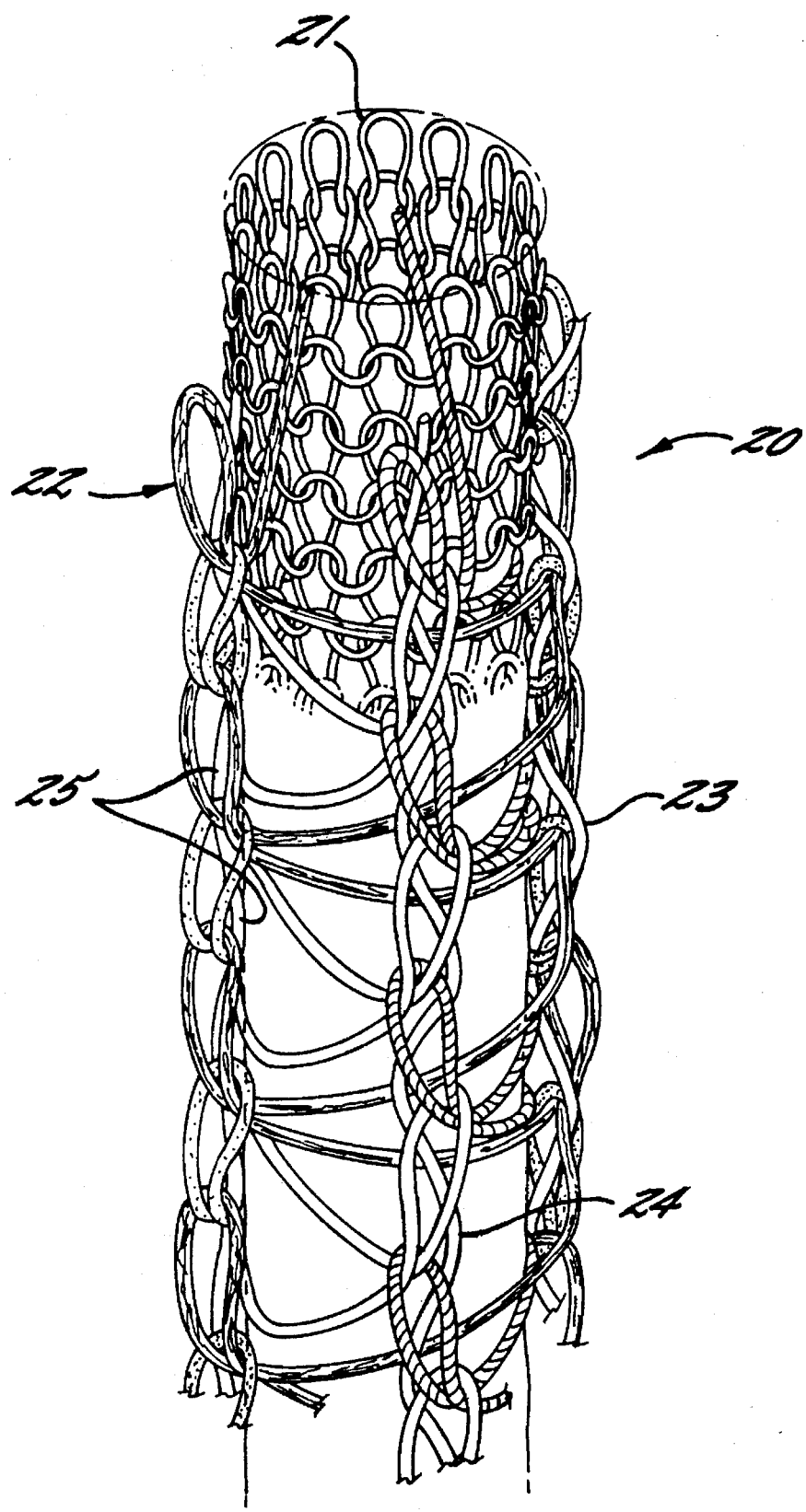
FIG. 3 is a third EMI gasket according to the present invention in which the core is the tubular knitted structure from monofilament yarns, and the sheath is a circular warp knitted structure with interlace yarns.

For the sake of clarity and illustration, the circular warp knit material illustrated in FIGS. 1 and 3 is shown in somewhat simplified fashion, and specifically with fewer yarns than in a preferred commercial product. It will be understood that the principles of circular warp knitting, and the advantages of the present invention, can be completely understood with respect to FIGS. 1 and 3, and that more complex drawings with larger numbers of yarns would be more confusing rather than more illustrative.

As noted above, the circular warp knitted sheath 12 is sufficiently conductive to provide shielding from electromagnetic interference over a wide range of frequencies. In a preferred embodiment, the conductive sheath obtains its shielding properties from being comprised of conductive yarns. Again, the term "yarns" is used in its generic sense and refers to a continuous strand of fibers, filament, or other material in a form suitable for knitting, weaving, or otherwise entwining to form a textile fabric. As used herein, the term "yarn" can include numbers of fibers twisted together to form spun yarn, a number of filaments laid together without twist, a number of filaments laid together with a degree of twist, a single filament with or without twist (monofilament), or a narrow strip of material with or without twist intended for or used in a textile construction, *Dictionary of Fiber and Textile Technology*, supra.

Conductive yarns can be formed with several constructions, and in preferred embodiments of the invention, the conductive yarns comprise either nonmetallic yarns in which selected, most, or even all yarns are coated with metal, or fully metal yarns. Typically, conductive yarns and nonmetallic yarns such as polymeric yarns are used together to form the circular warp knitted sheath of the present invention. In particularly preferred embodiments, the polymeric yarns in the sheath comprise highly oriented, high modulus yarns. As is known to those familiar with synthetic polymer materials suitable for textile applications, orientation refers to the degree of parallelism of the molecules in linear polymeric structures. The term "modulus" refers to the ratio of change in stress to change in strain following the removal of crimp from the yarn being tested. Modulus is usually expressed in force per unit linear density or force per unit area of a specimen, and strain is generally expressed as either a fraction of a yarn's original length, or its percentage elongation under a specified condition. As will be discussed further herein, such high modulus yarns provide particular advantages in an EMI gasket structure.

In preferred embodiments, the sheath can include at least some yarns selected from the group consisting of silver coated nylon, spun stainless steel, beryllium-copper alloy wire, or any other conductive yarn including graphite and conductive polymers, and combinations thereof. Some of these have advantages as to their ease of knitting, while others are more difficult to knit, so that an appropriate choice can be made on the basis of a number of characteristics.

Circular warp knit sheath structures according to the present invention have been unexpectedly found to offer approximately twice the EMI shielding properties of weft knitted or woven structures when formed from the same types of conductive yarns. Although the inventors do not wish to be bound by any particular theory, it appears that a circular warp knit structure offers more points of contact between the gasket and the surfaces that it connects, as well as within the gasket itself. The larger number of contact points in turn give the circular warp knit structure the ability to interrupt a wider range of EMI frequencies, thus providing greater and more efficient shielding properties.

Figure 4:
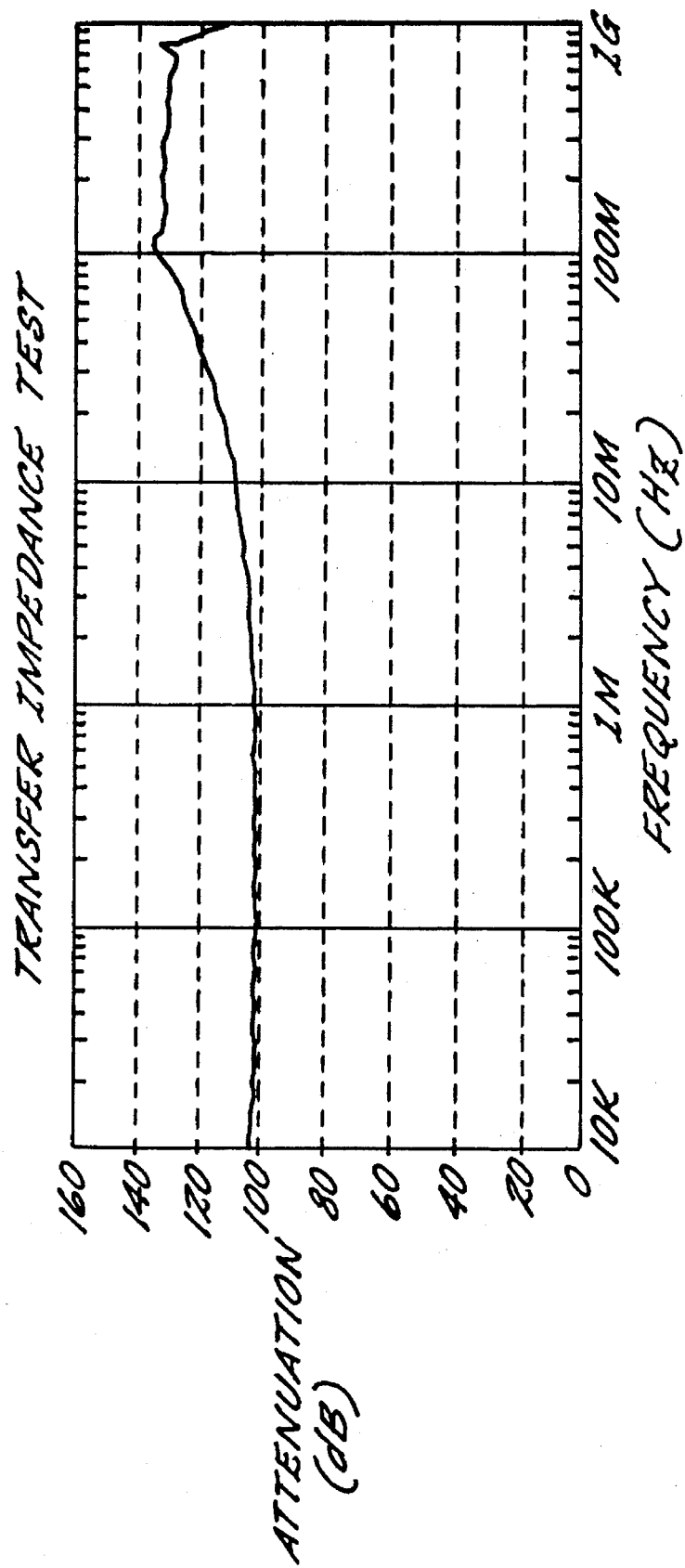
FIG. 4 is a plot of attenuation versus field frequency demonstrating the shielding performance of the present invention.

FIG. 4 demonstrates the effectiveness of gaskets formed according to the present invention. In FIG. 4, the attenuation represents a reduction in signal strength, expressed in decibels, which in turn measures an absorption loss of the electromagnetic radiation (i.e. emission). The frequency represents the oscillation frequency of the electromagnetic field against which the shielding performance of the gasket is being measured. The gasket used in the measurements of FIG. 4 was a circular warp knit of silver plated nylon yarns with an elastomeric core.

In the preferred embodiment, the conductive sheath further comprises an adhesive, preferably a hot melt adhesive, for preventing the gasket from fraying when cut to specific lengths. The adhesive is present at ambient temperatures in the form of one of the knitted yarns, or most preferably as one or more of the interlaced yarns described herein. As known to those familiar with such compositions, hot melt adhesives can be described as solid thermoplastic materials that melt quickly upon heating and then set to a firm bond on cooling; Lewis, *Hawley's Condensed Chemical Dictionary*, 12 ed., 1993.

In a most preferred embodiment, the sheath 12 is longitudinally stabilized with an interlaced yarn as perhaps best illustrated in FIG. 3, and will be discussed later herein in reference to the particular embodiment illustrated in FIG. 3.

FIG. 2 shows a second embodiment of an EMI gasket broadly designated at 15. This embodiment includes a knitted core of monofilament synthetic polymer yarns 16 and a conductive sheath 17 over the knitted core 16 with the sheath 17 being sufficiently conductive to provide shielding from electromagnetic interference. In the embodiment of FIG. 2, the conductive sheath 17 comprises a fabric selected from the group consisting of woven fabrics, weft knitted fabrics, and warp knitted fabrics, and which can include conductive yarns in a manner similar to the sheath described with respect to FIG. 1.

The knitted core illustrated in FIG. 2 formed from the monofilament synthetic polymer yarns, particularly highly oriented, high modulus synthetic polymer yarns, provides fundamental advantages in an EMI gasket. When such monofilaments are formed into a warp knit stitch, radial torsional forces are in turn formed in the respective loops. In turn, these loops can be compressed by a closure force in radial compression similar to the manner in which a coil can be compressed. This is in improved contrast to the perpendicular forces expressed in the non-oriented axis of less oriented, low modulus materials.

The low closure forces offered by such a knitted monofilament structure, when spread across the mating surface area (for example, between about 6 and 8 pounds per linear foot of the gasket) translate to extremely low compressive forces in the knit monofilament loop. Such a knitted loop structure is, by its nature, resistant to compression set, unlike some of the resilient polymers referred to earlier used as solid cores. Furthermore, the large empty areas and loop lengths that are intrinsic to a knit structure—particularly a warp knit structure—allow for large deformation and full recovery while concurrently permitting low or very moderate closure forces.

A knit core material also is free of torque bias that would otherwise inhibit free movement, thereby giving the resulting gasket superior suppleness and the ability to conform easily to curved or other irregular surfaces.

Furthermore, the large void areas intrinsic to the knitted construction have an additional advantage of allowing sharp bends in the gasket without undue distortion in the gasket's volume or its shape. This characteristic ensures intimate and full contact of the conductive elements of the gasket with all of the surfaces in which they are in contact.

In preferred embodiments, the knitted core comprises synthetic polymer monofilament yarns selected from the group consisting of polyester, nylon, polyethylene, polypropylene, and combinations thereof.

As noted above, FIG. 3 illustrates yet another embodiment of the present invention, one which combines the advantages of the circular warp knitted sheath, the knitted monofilament core, and potentially the longitudinal stabilization of an interlaced or "laid-in" yarn.

In FIG. 3, the gasket structure is broadly designated at 20. The knitted core of monofilament synthetic polymer yarns is shown at 21, and the circular warp knitted sheath is broadly designated at 22, and as illustrated, is over the monofilament knitted core 21 and is sufficiently conductive to provide shielding from electromagnetic interference over a wide range of frequencies.

FIG. 3 further illustrates that in a preferred embodiment, the sheath 22 is longitudinally stabilized with an interlaced yarn. FIG. 3 shows three such yarns 23, 24, and 25, which are interlaced or "laid-in" among the circularly knitted yarns. Such a circular warp knit structure with interlaced yarns is thoroughly described both as to its structure and the method of its manufacture in U.S. Pat. Nos. 4,838,043 and 4,977,759, both to Jencks, and both of which are incorporated entirely herein by reference.

One of the particular advantages of using the Jencks '043 and '759 techniques and resulting structures is that the interlace yarn (or yarns) can be used to desirably shape the sheath 22 as well as longitudinal stabilize it. The shape of the sheath 22 can be controlled by the number and placement of the interlace yarns.

For example, FIG. 3 shows an embodiment with four interlace yarns, three of which, 23, 24, and 25, are illustrated, and the fourth of which would be in the rear of the gasket 20 as it is oriented in FIG. 3. In particular, if two interlace yarns are used, they can form at least one substantially flat side for the gasket 20 which can be advantageous in securing it to a cabinet or other flat surface. Similarly, if the sheath 22 is stabilized by three interlace yarns, a gasket with a substantially triangular cross-section can be produced, and as illustrated in FIG. 3, if four interlace yarns are used, they can form a substantially square cross section. It will be understood that the terms "triangular" and "square" are used descriptively and not in any absolute sense as the knitted structure is basically circular, but the interlacing gives sufficient polygon characteristics to the otherwise circular gasket to provide advantageous contact with desired surfaces. The interlace yarns can also produce more oval shapes as well as polygonal ones.

In the embodiment illustrated in FIG. 3, either the interlace yarns or the warp knit yarns, or both, can be made conductive. As in the earlier embodiments, the conductive yarns can comprise metal yarns or nonmetallic yarns carrying a metal coating, and can similarly include materials such as graphite (carbon) or conductive polymers. Depending upon the frequency range and amount of shielding required in any particular application, some or all of the yarns can be conductive.

As discussed with respect to the embodiment of FIG. 2, the nonmetallic yarns in both the core 21 and in the sheath 22 can preferably comprise highly oriented, high modulus yarns to give all of the advantageous characteristics described earlier with respect to such yarns.

In preferred embodiments, one or more of the interlace yarns could comprise a yarn formed of a hot melt polymer for providing an advantageous method of securing the core and the sheath 22 with one another or with a desired surface.

In yet a fourth embodiment of the present invention, it will be understood from the description herein that there are advantages to the circular warp knit sheath structure, there are advantages to the monofilament knitted core structure, and there are advantages to the interlaced circular warp knit structure. Thus, a fourth embodiment of the invention can comprise a single circular warp knitted structure longitudinally stabilized with interlace yarns, with or without a core; i.e., a tubular fabric. As in the other embodiments, the preferred method of making the gasket conductive is to use conductive yarns which in turn can comprise metal yarns or nonmetallic yarns coated with metal. For example, in a preferred embodiment, the tubular fabric can comprise copper yarns and nylon yarns. As noted above, a knitted structure, whether warp or weft knitted, offers superior advantages in terms of its compression and resiliency, along with the ability to be bent in rather sharp fashion without any disadvantageous effects, and with full recovery. As set forth earlier, the use of highly oriented, high modulus yarns enhances all of these characteristics.

In the drawings and specification, there have been disclosed typical preferred embodiments of the invention and, although specific terms have been employed, they have been used in a generic and descriptive sense only and not for purposes of limitation, the scope of the invention being set forth in the following claims.

That which is claimed is:

1. A gasket for shielding from electromagnetic emissions (EMI), and exhibiting excellent characteristics of recovery, bending, and tangential compression, said gasket comprising:
   a knitted tubular core of monofilament synthetic polymer yarns; and
   a conductive sheath over said tubular knitted core, said sheath being sufficiently conductive to provide shielding from electromagnetic interference.

2. A gasket according to claim 1 wherein said conductive sheath comprises a fabric selected from the group consisting of woven fabrics, weft knitted fabrics and warp knitted fabrics.

3. A gasket according to claim 2 wherein said conductive sheath comprises conductive yarns.

4. A gasket according to claim 3 wherein said conductive yarns comprise metal yarns.

5. A gasket according to claim 3 wherein said conductive yarns comprise nonmetallic yarns in which selected yarns are coated with metal.

6. A gasket according to claim 1 wherein said knitted core comprises synthetic polymer yarns selected from the group consisting of: polyester, nylon, polyethylene, polypropylene, and combinations thereof.

7. A gasket according to claim 1 wherein said monofilament yarns comprise highly oriented, high modulus yarns.

8. A gasket for shielding from electromagnetic emissions (EMI), and exhibiting excellent characteristics of recovery, bending, and tangential compression, said gasket comprising:
   a knitted core of monofilament synthetic polymer yarns; and
   a circular warp knitted sheath over said monofilament knitted core, said sheath being sufficiently conductive to provide shielding from electromagnetic interference over a wide range of frequencies.

9. A gasket according to claim 8 wherein said sheath is longitudinally stabilized with an interlaced yarn.

10. A gasket according to claim 9 wherein said interlaced yarn is a conductive yarn.

11. A gasket according to claim 8 wherein said sheath is stabilized by two interlaced yarns that form at least one substantially flat side of said gasket.

12. A gasket according to claim 8 wherein said sheath is stabilized by three interlaced yarns that form a substantially triangular cross-section gasket.

13. A gasket according to claim 8 wherein said sheath is stabilized by four interlaced yarns that form a substantially square cross-section gasket.

14. A gasket according to claim 8 wherein said knitted sheath comprises conductive yarns.

15. A gasket according to claim 14 wherein said conductive yarns comprise nonmetallic yarns in which selected yarns are coated with metal.

16. A gasket according to claim 14 wherein said conductive yarns comprise metal yarns.

17. A gasket according to claim 8 wherein said knitted sheath comprises conductive yarns and polymeric yarns.

18. A gasket according to claim 8 wherein said knitted core comprises highly oriented, high modulus yarns.

19. A gasket according to claim 17 wherein said polymeric yarns in said knitted sheath comprise monofilament yarns.

20. A gasket according to claim 8 wherein said core is warp knitted.

21. A gasket according to claim 8 wherein said core is weft knitted.

22. A gasket according to claim 8 wherein said conductive sheath further comprises an adhesive for securing said sheath to said core, and for preventing said gasket from fraying when cut to specific lengths.

* * * * *